United States Patent [19]

Ahn et al.

[11] 4,268,584
[45] May 19, 1981

[54] NICKEL-X/GOLD/NICKEL-X CONDUCTORS FOR SOLID STATE DEVICES WHERE X IS PHOSPHORUS, BORON, OR CARBON

[75] Inventors: Kie Y. Ahn, Chappaqua; Christopher H. Bajorek, Goldens Bridge; Paul S. Ho, Chappaqua; Robert J. Miller, Yorktown Heights; John V. Powers, Shenorock, all of N.Y.

[73] Assignee: International Business Machines Corporation, Armonk, N.Y.

[21] Appl. No.: 103,969

[22] Filed: Dec. 17, 1979

[51] Int. Cl.$^3$ .................. B32B 15/00; B05D 5/12
[52] U.S. Cl. .................. 428/620; 29/604;
357/67; 357/71; 427/88; 427/89; 427/92;
428/621; 428/622; 428/632; 428/672; 428/680;
428/929
[58] Field of Search .............. 428/620, 621, 622, 632,
428/929, 672, 680; 29/604; 427/88, 89, 92;
357/67, 71

[56] References Cited

U.S. PATENT DOCUMENTS

| | | | |
|---|---|---|---|
| 3,362,851 | 1/1968 | Dunster | 428/672 X |
| 3,617,816 | 11/1971 | Riseman et al. | 357/67 X |
| 3,634,209 | 1/1972 | Wolf et al. | 428/621 X |
| 3,645,785 | 2/1972 | Hentzschel | 428/620 |
| 3,738,818 | 6/1973 | Stone et al. | 428/672 X |
| 3,949,120 | 4/1976 | Leibfried et al. | 357/67 X |
| 3,970,433 | 7/1976 | Warmka et al. | 428/672 |
| 4,013,803 | 3/1977 | Josephs | 427/93 X |
| 4,017,890 | 4/1977 | Howard et al. | 357/67 |
| 4,166,279 | 8/1979 | Gangulee et al. | 357/71 |

FOREIGN PATENT DOCUMENTS

6909889 12/1970 Netherlands .................. 428/620 X

Primary Examiner—L. Dewayne Rutledge
Assistant Examiner—W. G. Saba
Attorney, Agent, or Firm—Graham S. Jones, II

[57] ABSTRACT

A laminated conductor includes a lower thin film of nickel-X alloy or pseudo alloy deposited upon a substrate containing silicon or upon a substrate intended for use as a magnetic bubble storage device. Upon the film of nickel-X alloy, a thicker film of gold is deposited as the conductive portion of the conductor. On the upper surface of the gold layer is deposited a thin film of nickel-X alloy. Failure of the conductor because of electromigration is reduced dramatically as compared with use of molybdenum instead of nickel in the laminated structure. The nonmagnetic nickel-X alloy does not interfere with magnetic fields or produce unwanted magnetic fields.

14 Claims, 2 Drawing Figures

NICKEL-X/GOLD/NICKEL-X CONDUCTORS FOR SOLID STATE DEVICES WHERE X IS PHOSPHORUS, BORON, OR CARBON

BACKGROUND OF THE INVENTION

1. Field of the Invention

This invention relates to conductors for solid state devices and more particularly to multiple layer conductors.

2. Description of Prior Art

Magnetic bubble applications require thin film conductors to pass larger current densities than any other application in the microelectronics industry. Pulse current densities exceeding $1 \times 10^7$ amperes/cm$^2$ have been reported by Kinsbron et al, Proceedings of the 16th IEEE Reliability Physics Symp., April 1978, p. 248. Thus, metallurgies for thin film conductors in these applications must be exceptionally resistant to electromigration-induced failure.

Conductors serve a variety of functions in magnetic bubble applications, and the current density and the amount of operation the conductor receives is dependent on its function. Typical conductor functions and the type of usage received are listed in Table I.

TABLE I

Conductor Functions in Magnetic Bubble Devices

| Function | Current Density | Duty | Pulse Duration |
| --- | --- | --- | --- |
| Bubble Generator (Nucleator) | Very High | Frequent | Very Short |
| Data Switch | High | Frequent | Moderate |
| Transfer Switch | High | Infrequent | Moderate |
| Replicator | High | Frequent | Moderate |
| Bubble Stretcher | Moderate | Frequent | Long |

Legend:
| | |
| --- | --- |
| Current Density | Very High ($1 \times 10^7$ amps/cm$^2$) |
| | High ($4 \times 10^6$ amps/cm$^2$) |
| | Moderate ($2 \times 10^6$ amps/cm$^2$) |
| Duty | Frequent (e.g., every 4 $\mu$sec.) |
| | Infrequent (e.g., every 400 $\mu$sec.) |
| Pulse Duration | Very short (e.g., 40 nsec.) |
| | Moderate (e.g., 1-2 $\mu$sec.) |
| | Long (e.g., 2-4 $\mu$sec.) |

In general, continuous (d.c.) currents are not encountered in magnetic bubble devices.

Unidirectional current pulses in the current density ranges used in bubble domain devices induce motion of the atoms comprising the thin film conductor, an effect known as electromigration. Electromigration induces crack or void formation in the conductor which, over a period of time, can result in conductor failure. The rate of electromigration is dependent on the conductor material, the current density imposed on the conductor and the conductor temperature. In high current density applications, potential conductor failure due to electromigration can severely limit the reliability of the circuit. Electromigration can cause an additional problem in magnetic bubble domain devices when a passivation layer such as glass, silicon nitride, or silicon dioxide is overlaid on the device, as is typically done in the industry. This layer can fracture as a result of the removal and build-up of conductor material. This fracture can expose conductors to the atmosphere which may cause corrosion.

Conventionally, in the microelectronics industry, aluminum has been used as the conductor material. For the current density requirements of magnetic bubble devices, aluminum conductors are not reliable because of their susceptibility to electromigration. Several metallurgical systems have been proposed previously in which electromigration occurs more slowly than in pure aluminum conductors, thus leading to longer conductor life or the ability to impose higher current densities on the conductor. Among the proposed metallurgical systems are AlCu, Ta/Au/Ta, Al-intermetallic configurations and Au-intermetallic configurations.

The basic requirements which a metal or metal system (i.e., a configuration of one or more metals, either as an alloy, pseudo-alloy, or layered structure) must achieve in order to be a suitable candidate for use as a thin film conductor in integrated, solid state circuits or magnetic bubble devices are summarized as follows:

(1) high electrical conductivity—only materials having high electrical conductivity are considered because low conductivity values lead to excessive Joule heating and too large a voltage loss in the conductor, or the alternative of making the conductor with an unacceptably large cross-sectional area.

(2) corrosion resistance—conductor materials which are susceptible to corrosion, even if they are relatively resistant to electromigration induced failure, are prone to fail from corrosion effects over the intended lifetime of the device.

(3) chemical stability with regard to other materials with which the conductor will be in contact in the magnetic bubble device; such materials are typically silicon dioxide, and ferromagnetic garnet materials such as rare earth substituted gallium or germanium iron garnets, e.g., $EuTm_{1.26}Y_{0.48}Ga_{0.5}Fe_{4.5}O_{12}$.

(4) In some magnetic bubble applications, NiFe patterns are fabricated either crossing or directly on top of the thin film conductors. These NiFe patterns serve to direct the motion of the magnetic bubble domains in the bubble storage layer. The thin film conductor metal system must be compatible with the NiFe patterns. Two exemplary areas of concern are interdiffusion of the conductor metal system with the NiFe patterns and topography (specifically grain size and roughness) of the thin film conductor which influences the coercivity of the NiFe patterns. Larger coercivity is to be avoided because it requires excess magnetic energy for domain rotation, thus smooth, small grained films are preferred.

(5) For magnetic bubble applications, the conductor structure is required to be nonferromagnetic because a magnetic conductor would interfere with the directed motion of the magnetic bubble domains.

(6) adhesion to the substrate on which the thin film conductor is fabricated, and adhesion to the passivating layer applied over the thin film conductor. This passivating layer insulates the conductor and provides a degree of protection against corrosion. Thus, adhesion to silicon dioxide and possibly garnet materials is required.

(7) compatibility with later processing of the device. This compatibility may take the form of metallurgical stability under elevated temperature conditions encountered in processing, and resistance to chemical attack by certain chemical agents to which the conductor may become exposed in processing.

(8) ability to be deposited by the fabrication techniques in common use within the industry for metal deposition, for example by vapor deposition, sputter deposition, or electroplating.

(9) certain properties of the film's grain structure are also important. In order to obtain adequate line definition by a lift-off process, the film should be small grained, with a grain size not exceeding about one-third of the required linewidth. Uniformity of grain size and preferred crystallographic orientation of the grains are also factors which promote longer electromigration limited conductor lifetimes. Fine grained films are also smoother, which is a desirable quality in magnetic bubble applications to lessen difficulties associated with covering the conductor with an overlayer.

No single metal is exceptionally well suited to satisfying all of the above requirements. Aluminum, copper, silver, and gold provide high conductivity, but of them only Al adheres well to silicon dioxide and garnet films used in magnetic bubble devices.

Using metal systems (i.e., combinations of metals) significant progress has been achieved toward reducing the effects of electromigration in thin film conductors. A recent review of advances in using Al-based metal systems is provided in U.S. Pat. No. 4,017,890 of Howard et al which is commonly assigned.

Adhesion problems encountered in using Ag, Au or Cu conductors have been overcome by using adhesion layers between the conductor and the material to which it must adhere. However, Ag is susceptible to corrosion. Cu is also susceptible to corrosion, although to a lesser degree.

Au provides a high degree of resistance to electromigration induced failure, and to corrosion, is not attacked by most chemical agents, and is easily deposited in pure form by vapor deposition, sputter deposition, or electroplating. With proper techniques of deposition, it forms a small, uniform grain structure, with strong preferred orientation of the (111) crystallographic direction normal to the film plane. Au in conjunction with Ta adhesion layers has been proposed as an electromigration resistant metallurgy for semiconductor applications by Riseman et al in U.S. Pat. No. 3,617,816 which is also commonly assigned. Au in conjunction with adhesion layers of Nb, Hf, or Zr, which form intermetallic compounds with Au, has been proposed by Gangulee et al in U.S. Pat. No. 4,166,279, which is commonly assigned, wherein there is also a review of other advances in using Au-based metal systems.

OBJECT OF THE INVENTION

It is an object of this invention to provide an improved new metallurgical conductor system using Au as the conductive layer.

Another object is that the metallurgical system should offer increased resistance to electromigration induced conductor failure as compared to the prior art, and should not depend on the formation of intermetallic compound layers of Au and the adhesion layer metal.

Still another object of this invention is to provide nonferromagnetic conductors suitable for carrying high current densities with high reliability in magnetic bubble devices.

A BRIEF DESCRIPTION OF THE DRAWINGS

DESCRIPTION OF THE PREFERRED EMBODIMENT

Figure 1:
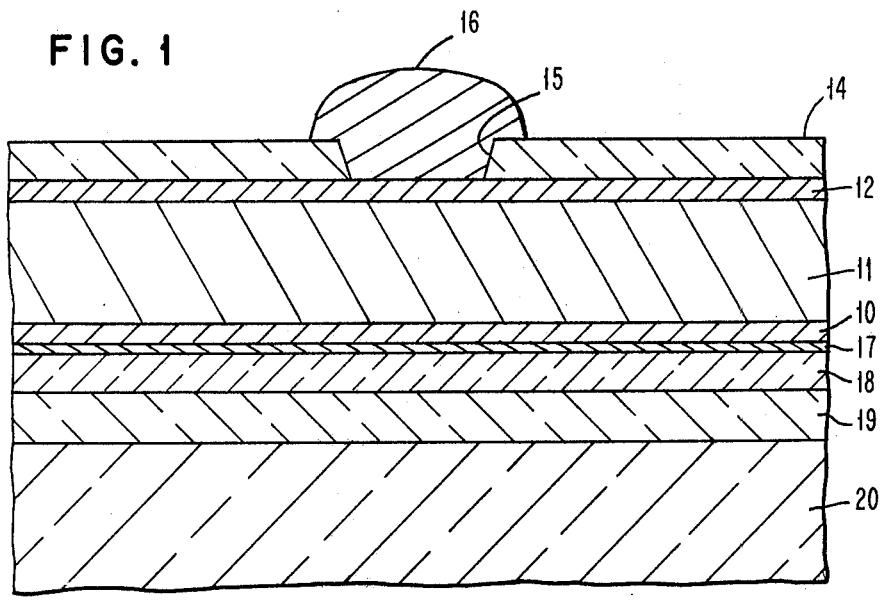
FIG. 1 shows a sectional view of a bubble device carrying a layered conductor in accordance with this invention.

A three-layered conductor structure Ni-X/Au/Ni-X 10, 11, 12 on a bubble device is shown in FIG. 1. X is an element selected from the group consisting of phosphorus, boron, and carbon. Ni-X is an alloy or psuedo-alloy of Ni and one or more of the X elements. In accordance with this invention, Ni-X alloys employed should be nonferromagnetic to prevent interference with the directed motion of the bubble domains by the conductor structure. A garnet substrate 20 is covered with a thin film magnetic bubble storage layer 19. Above layer 19 is a silicon dioxide spacer layer 18, covered in places with plating base 17, and the conductor structure 10, 11, 12 which is protected by $SiO_2$ passivation layer 14. Layer 12 is connected at opening 15 to a solder ball contact 16. Wire bonding can be employed, as well. The Ni-X layers 10 and 12 act as adhesion layers to silicon dioxide passivation layer 14 and spacer layer 18. The Ni-X layers also act as diffusion barriers to keep Au layer 11 from coming into contact with either silicon dioxide layer, an occurrence which would have detrimental effects on the adhesion of the conductor to those layers.

Figure 2:
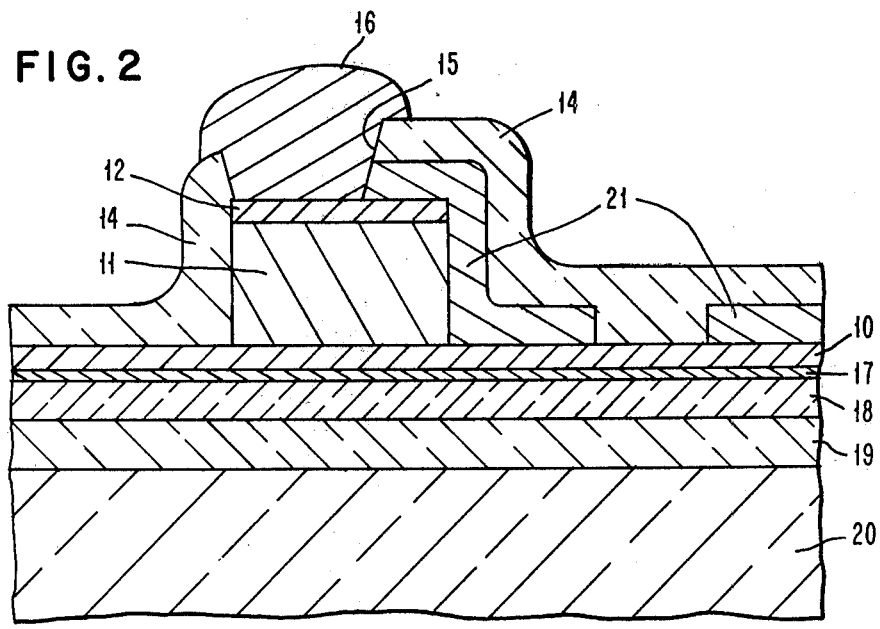
FIG. 2 shows a modified version of FIG. 1 with a bubble propagation structure.

FIG. 2 shows a modified version of FIG. 1 in which a permalloy (NiFe) film 21 is deposited in places upon the lower Ni-X layer 10 and in other places upon the upper Ni-X layer 12 by means of electroplating to provide a bubble propagation structure in the bubble device.

Ni does not form intermetallic compounds with Au, but is soluble in Au up to approximately 10 atomic % at the temperatures of interest. Au is not soluble in Ni-X, and as a result, Au does not easily diffuse through the Ni-X layers. Therefore, problems such as the loss of adhesion or Au-$SiO_2$ reaction are not encountered. One Ni-X material we have plated for layers 10 and 12 is Ni-Phosphorus. During the plating of Ni-P, the P is dispersed through the Ni layer and is most likely to be found at grain boundaries. The plated Ni-P film has a smooth, very fine grained (virtually amorphous) structure. During subsequent annealing, grain growth, which would result in surface roughening, is inhibited by the presence of P, so the film remains smooth. The coercivity of superimposed NiFe layers thereby remains low. No detrimental effects on NiFe films as a result of Ni-P layers have been observed during annealing procedures. Nor was any reversion of the Ni-P toward a ferromagnetic state observed.

The presence of Ni dissolved in the Au conductor layer 11 results in an increase in the resistivity of that layer. However, the magnitude of the increase can be controlled by limiting the annealing time and temperature of the conductor so that the resistivity increase is tolerable for bubble device applications. Furthermore, since the solubility of P in Au is negligible, the addition of P to the Ni layer does not promote a larger resistivity increase in the Au layer than is observed with Ni alone (i.e., comparing Ni-P/Au to Ni/Au). A comparison of the relative amounts of resistivity increase caused by various metals dissolved in Au is presented in Table II for layer thicknesses of 100 nm each. Dissolution was promoted by annealing thin films at a temperature of 327° C. for 50 hours. Like Au, the Ni-X alloy can be deposited onto the substrate by vapor deposition, sputter deposition or electroplating, and it forms a smooth, fine grained structure.

A further benefit of the smooth, small grained structure of the Ni-X layers is realized in the electromigration lifetime of the conductors. Grain growth and surface roughening during annealing tend to cause a nonuniform grain size distribution in the Au layer. A conductor with nonuniform grain size is less reliable because the variation in grain size causes a larger spread in the distribution of conductor lifetimes. By maintaining a smooth surface and a small grain size, the Ni-X layer enhances the desirable result of a tight distribution of electromigration lifetimes, hence a more reliable thin film conductor.

TABLE II

Resistivity and Resistivity Changes of Various Gold-Based Metal Systems

| Transition Metal- Addition | Gold- Metal Resistivity $\mu\Omega$-cm | Gold Compound Resistivity Increase $\mu\Omega$-cm | % Change In Resistivity |
|---|---|---|---|
| Ti | 2.5 | 15.0 | 600 |
| Cr | 2.5 | 30.0 | 1200 |
| V | 2.5 | 80.0 | 3200 |
| Ta | 2.5 | 1.25 | 50 |
| Nb | 2.5 | 0.50–0.75 | 20–30 |
| Hf | 2.5 | 1.0 | 40 |
| Zr | 2.5 | 1.25 | 50 |
| Ni-P | 2.5 | 1.0 | 40 |

The presence of Ni-X dissolved in the Au conductor layer 11 has a strongly beneficial effect on the ability of that layer to resist electromigration induced failure. Table III compares electromigration lifetime of Ni-P/Au/Ni-P to various Au-based conductor metal systems. All conductors were 620 $\mu$m in length, 2.5 $\mu$m in width, with adhesion layer thickness of 25 nm and Au layer thickness of 400 nm. They were d.c. powered with a current density of either $2\times10^6$ amperes/cm$^2$ or $4\times10^6$ amperes/cm$^2$ in ovens maintaining an ambient temperature of 300° C.

The ambient atmosphere in the ovens was dry N$_2$ gas. A minimum of twelve conductors of each metal system was tested. The lifetime value of the Mo/Au/Mo conductors can be taken as representative of the lifetime of a pure Au conductor since Mo and Au do not interdiffuse, nor do they form intermetallic compounds with one another. The lifetime of Nb/Au/Nb conductors is representative of those systems which do form Au intermetallic compounds.

TABLE III

Electromigration Lifetime of Various Gold-Based Conductor Metal Systems

| Layer Configuration | Thickness nm $(10^{-9}$m) | Current Density (amp/cm$^2$) | Median Lifetime (hrs.) |
|---|---|---|---|
| Mo/Au/Mo (Evap.) | 25/400/25 | $2\times10^6$ | 120 |
| Mo/Au/Mo (Evap.) | 25/400/25 | $4\times10^6$ | 16 |
| Mo/Au/Mo (Sputt.) | 25/400/25 | $2\times10^6$ | 400 |
| Mo/Au/Mo (Sputt.) | 25/400/25 | $4\times10^6$ | 17 |
| Nb/Au/Nb (Evap.) | 25/400/25 | $2\times10^6$ | 900 |
| Nb/Au/Nb (Evap.) | 25/400/25 | $4\times10^6$ | 75 |
| Nb/Au/Nb (Sputt.) | 25/400/25 | $2\times10^6$ | 2,800 |
| Nb/Au/Nb (Sputt.) | 25/400/25 | $4\times10^6$ | 200 |
| Ni-P/Au/Ni-P (Pltd.) | 25/400/25 | $2\times10^6$ | 10,000+ |
| Ni-P/Au/Ni-P (Pltd.) | 25/400/25 | $4\times10^6$ | 10,000+ |

Table IV presents the electromigration lifetime of sets of conductors identical to those in Table III but tested under pulse powering conditions in a dry N$_2$ atmosphere at 300° C. The pulse period was 50 $\mu$sec and the pulse duration was 15 $\mu$sec. The pulse current density was $4\times10^6$ amperes/cm$^2$.

TABLE IV

Electromigration Lifetime of Gold-Based Conductor Metal Systems Tested Under Pulsed Powering Conditions

| Layer Configuration | Thickness (nm $(10^{-9}$m) | Median Lifetime (hrs.) |
|---|---|---|
| Mo/Au/Mo (Evap.) | 25/400/25 | 125 |
| Mo/Au/Mo (Sputt.) | 25/400/25 | 260 |
| Nb/Au/Nb (Evap.) | 25/400/25 | 900 |
| Nb/Au/Nb (Sputt.) | 25/400/25 | 1,700 |
| Ni-P/Au/Ni-P (Pltd.) | 25/400/25 | 10,000+ |
| Temperature | 300° C. | |

The data presented in Tables III and IV indicate the superiority of the Ni-P/Au/Ni-P conductor metal system over other Au-based metal systems. The increased ability of Ni-X/Au/Ni-X to resist electromigration induced failure appears to be a result of Ni atoms being present within Au grains and Ni atoms (and perhaps some X atoms) at grain boundaries throughout the Au layer, unlike the case of three-layer metal systems which form intermetallic compounds. In those systems, the intermetallic compound forms primarily as a planar layer at the Au/adhesion layer interface, rather than throughout the full height of the Au conductor film thickness, and the Au grains have few or no adhesion layer atoms within them. This latter point can be inferred from the determination that the solubility of those materials in Au is small.

A high degree of flexibility is available in the details of fabricating Ni-X/Au/Ni-X thin film conductors. This allows the fabrication method and the layer thicknesses to be tailored to the specific application. To achieve optimum performance of the invention, some guidelines should be followed.

It is preferable that the sequential depositions of the three layers (Ni-X, Au, and Ni-X) be performed in such a manner as to prevent the opportunity for surface contaminants to collect on the metal surfaces. Each Ni-X layer should be sufficiently thick that it becomes a continuous adhesion layer, and so that it is adequately effective as a barrier against the diffusion of Au to the substrate surface. However, any thickness exceeding that is permissible. A practical minimum is about 10 nm with the maximum being some 100 nm or more, depending on the tolerable total thickness of the three-layer structure. The Au thickness is in general fabricated no less than twice the thickness of either Ni-X layer, in order that the Au act as the primary current carrier. The specific application and fabrication procedures generally restrict the maximum thickness of the entire three-layer structure, since making thin film conductors appreciably thicker than they are wide becomes impractical in the industry. Typical Au thicknesses range from 100 nm to 2000 nm. Once the layers have been deposited to their appropriate thicknesses, the substrate carrying the layers should be heat treated at a temperature between 200° C. and 400° C. for a time period of sufficient length to permit dissolution of Ni atoms into the Au layer. The occurrence of this dissolution is detectable by the change in resistance of the thin film structure.

As an example of the application of these guidelines, one preferred method of embodying the invention is described. The method presented is that used to obtain the samples for lifetest experiments, the results of which are described in Tables III and IV.

The three depositions were performed sequentially by electroplating. First a Ni-P layer is deposited onto the substrate to a thickness of 25 nm. The electrolyte solution used for this electrodeposition is described in Table V. The bath is operated at a d.c. current density of 5 mA/cm$^2$ and a pH of 2.5. Turbulent agitation is supplied by means of a paddle sweeping back and forth at the cathode surface. The Ni-P deposits obtained in this manner are virtually amorphous films with grain size of less than 50 Å.

TABLE V

| Ni-P Plating Bath | |
| --- | --- |
| | Grams/L |
| $NiCl_2 \cdot H_2O$ | 109 |
| $Na_2H_2PO_2 \cdot H_2O$ | 15-20 |
| $H_3BO_3$ | 25 |
| Sodium Lauryl Sulfate | 0.4 |
| Saccharin | 5-8 |
| pH | 2.50 ± 0.05 |
| Current Density ($I_D$) | 5.0 mA/cm$^2$ ± 0.1mA/cm$^2$ |
| Agitation | 1 cycle/sec. |

A gold layer is then electroplated onto the Ni-P layer to a thickness of 400 nm. A second Ni-P layer is next plated onto this gold layer to a thickness of 25 nm.

An alternative method of deposition of the Ni-P layers by electroless techniques is now described. The wafers are thoroughly cleaned first by boiling them in a 5 percent Alconox solution for 20 min., followed by rinsing in running deionized (DI) water for 20 min. While awaiting sensitization, the wafers are stored in clean DI water. Sensitization (Symposium on Electroless Nickel Plating, ASTM Special Technical Publication No. 265, American Society of Testing Materials, 1959, p. 36) is carried out in an ultrasonic field. The wafer is immersed in a stannous chloride solution for 15 sec. Following a DI water rinse, the wafer is introduced to a palladium chloride solution for 15 sec. This stannous chloride/palladium chloride cycle is repeated to insure thorough sensitization. The wafers are rinsed upon removal from the palladium chloride solution and placed in the electroless nickel bath. At 50° C. the plating rate is approximately 10 Å/sec. In this case also, the nonmagnetic properties of the Ni-P alloy layer remain unchanged after annealing at 300° C. for 16 hours.

Using either method described or other methods, the phosphorus content of the films is on the order of 10 atomic percent, which is sufficiently high to render the films nonmagnetic.

The deposited films are patterned into individual conductors by means of ion milling, using a photoresist stencil as the patterning mask. Suitable alternative subtractive techniques for patterning through a stencil are sputter etching, reactive ion etching, chemical etching, plasma etching, and the like. The patterning can also be accomplished by selective, i.e., additive, plating techniques. A passivating overlayer was not deposited onto these patterned conductors; although such practice would be common in the industry, and has been shown to increase the electromigration limited lifetime of thin film conductors. Prior to testing, the conductors are annealed at 300° C. in forming gas (90% N$_2$ 10% H$_2$) for 16 hours to permit Ni diffusion into Au to occur. The methods of deposition and patterning herein employed are in routine use within the magnetic bubble industry. The annealing temperature is similar to that which the devices would incur in later processing, and is fully compatible with those processing conditions common to the industry.

Industrial Applicability

Conductors manufactured in accordance with this invention are suitable for general use in solid state devices, and in particular in magnetic bubble devices, wherein conductors must be deposited upon silicon, silicon dioxide and other substrates which are not compatible with using gold by itself as a conductor and which require conductor lifetimes in excess of those obtained with pure gold conductors. As gold and many other metals suffer from failure induced by electromigration, this combination permits overcoming of failures caused by electromigration or at least ameliorates problems associated with that phenomenon to a significant degree.

The conductors of this invention are particularly useful in cases in which they are combined with magnetic devices in which a ferromagnetic material such as nickel would produce a shielding, stray field or like effect which would interfere with operation of devices. Such devices would include magnetic bubble devices, magnetic recording heads or the like.

Having thus described our invention, what we claim as new and desire to secure by Letters Patent is:

1. In a laminated gold conductor including a conductor for a solid state device supported upon a substrate, the improvement comprising
   a first layer of nickel-X material, an intermediate layer of gold deposited upon said first layer, and
   a third layer of nickel-X material deposited upon said layer of gold,
   where X is an element selected from the group consisting of phosphorus, boron, and carbon.

2. In a laminated conductor for a magnetic bubble device supported by a substrate containing said magnetic bubble device, the improvement comprising:
   a first layer of nickel-X material, an intermediate layer of gold deposited upon said first layer, and
   a third layer of nickel-X material deposited upon said layer of gold,
   where X is an element selected from the group consisting of phosphorus, boron, and carbon.

3. A conductor in accordance with claim 1 or 2 wherein said layers of nickel-X material are within the range from 10 to 100×10$^{-9}$ meters thick and said gold layer is within the range from 100 to 2000×10$^{-9}$ meters thick.

4. A conductor in accordance with claim 1 or 2 wherein said layers of nickel-X material are on the order of 25×10$^{-9}$ meters thick and said layer of gold is on the order of 400×10$^{-9}$ meters thick.

5. A conductor in accordance with claim 1 or 2 wherein said layers of nickel-X material are on the order of 25×10$^{-9}$ meters thick and said layer of gold is on the order of 400×10$^{-9}$ meters thick, and said conductor has a width on the order of 7×10$^{-6}$ meters.

6. A conductor in accordance with claim 1 or 2 wherein said layers of nickel-X material and gold were deposited by plating.

7. A conductor in accordance with claim 1 or 2 wherein said layers of nickel-X material and gold were deposited by plating and were patterned by means of subtractive patterning technique employing a photoresist stencil as a mask, followed by annealing for several hours to diffuse Ni into Au.

8. A conductor in accordance with claim 1 or 2 deposited upon a surface of said substrate, said surface being composed of a dielectric material with said first nickel-X material layer of said conductor in contact with said substrate.

9. A conductor in accordance with claim 1 or 2 wherein said layers of nickel-X material and gold were deposited by plating and were patterned by means of ion milling while employing a photoresist stencil as a mask, followed by annealing at between 200° C. and 400° C. in forming gas for several hours to diffuse Ni into Au.

10. A conductor in accordance with claim 1 or 2 wherein said layers of nickel-X material and gold were deposited by plating and were patterned by means of etching while employing a photoresist stencil as a mask, followed by annealing at between 200° C. and 400° C. in forming gas for several hours to diffuse Ni into Au.

11. A conductor in accordance with claim 1 or 2 wherein said layers of nickel-X material and gold were deposited by plating and were patterned by means of sputter etching while employing a photoresist stencil as a mask, followed by annealing at about 300° C. in forming gas for several hours to diffuse Ni into Au.

12. A conductor in accordance with claim 1 or 2 wherein said layers of nickel-X material and gold were deposited in continuous form and were patterned by means of subtractive patterning technique employing a photoresist stencil as a mask, followed by annealing to diffuse Ni into Au.

13. A conductor in accordance with claim 1 or 2 wherein said layers of nickel-X material and gold were deposited and patterned by means of an additive technique employing a photoresist stencil as a mask, followed by annealing to diffuse Ni into Au.

14. A conductor in accordance with claim 1 wherein said substrate includes a semiconductor device.

* * * * *